(12) United States Patent
Moon

(10) Patent No.: US 9,595,961 B2
(45) Date of Patent: Mar. 14, 2017

(54) CAPACITANCE-SENSITIVE TOUCH SWITCH

(75) Inventor: Myung-Il Moon, Gwangmyeong-si (KR)

(73) Assignee: SILRYUK INDUSTRIAL CO., LTD, Ansan-si (KR)

( * ) Notice: Subject to any disclaimer, the term of this patent is extended or adjusted under 35 U.S.C. 154(b) by 22 days.

(21) Appl. No.: 14/131,355

(22) PCT Filed: Sep. 5, 2012

(86) PCT No.: PCT/KR2012/007135
§ 371 (c)(1),
(2), (4) Date: Mar. 21, 2014

(87) PCT Pub. No.: WO2013/176343
PCT Pub. Date: Nov. 28, 2013

(65) Prior Publication Data
US 2016/0072504 A1    Mar. 10, 2016

(30) Foreign Application Priority Data

May 25, 2012  (KR) .................. 10-2012-0056032
Jul. 5, 2012   (KR) .................. 10-2012-0073319

(51) Int. Cl.
*H03K 17/975*   (2006.01)
*H03K 17/96*    (2006.01)
*G06F 3/044*    (2006.01)

(52) U.S. Cl.
CPC ........... *H03K 17/962* (2013.01); *G06F 3/044* (2013.01)

(58) Field of Classification Search
CPC ......... H03K 17/975; H01H 35/00; G09G 5/00
USPC ........................................... 200/600; 307/112
See application file for complete search history.

(56) References Cited

U.S. PATENT DOCUMENTS

| 2001/0048247 A1* | 12/2001 | Bae ...................... G06F 3/0202 |
| | | 307/112 |
| 2006/0131159 A1* | 6/2006 | Kaps ..................... H03K 17/962 |
| | | 200/600 |
| 2007/0103451 A1 | 5/2007 | Heimann | |
| 2009/0107829 A1* | 4/2009 | Heimann ............. H03K 17/962 |
| | | 200/600 |

FOREIGN PATENT DOCUMENTS

| KR | 10-2002-0086405 A | 11/2002 |
| KR | 10-2011-0085166 A | 7/2011 |
| KR | 10-2011-0094568 A | 8/2011 |
| KR | 10-2011-0094571 A | 8/2011 |

* cited by examiner

*Primary Examiner* — Edwin A. Leon
*Assistant Examiner* — Iman Malakooti
(74) *Attorney, Agent, or Firm* — Revolution IP, PLLC

(57) ABSTRACT

The present invention relates to a capacitance-sensitive touch switch. The main purpose of the present invention is to provide a touch switch of an electronic device, which is capable of sensing constant variation of capacitance regardless of whether the cover panel of the front surface of the switch is curved or flat, and is capable of subtly sensing a variation in capacitance even when the electronic device is used over a long time.

10 Claims, 3 Drawing Sheets

(A)

(B)

CAPACITANCE-SENSITIVE TOUCH SWITCH

CROSS REFERENCE TO RELATED APPLICATIONS

The present application is a National Phase Application of International Application No. PCT/KR2012/007135, filed Sep. 5, 2012, which claims priority to Korean Patent Application No. 10-2012-0056032, filed May 25, 2012, and Korean Patent Application No. 10-2012-0073319, filed Jul. 5, 2012, which applications are incorporated herein fully by this reference.

TECHNICAL FIELD

The present invention relates to a touch switch, and more specifically, to a capacitance-sensitive touch switch which enables an electronic device to operate by sensing a variation in capacitance due to finger touch of the human body.

BACKGROUND ART

In general, various touch switches being operated by sensing a variation in capacitance have been known.

For example, as illustrated in (A) and (B) of FIG. 1, as a representative touch switch, there is Korean Patent Laid-Open Publication No. 10-2011-0094568 "a capacitance-sensitive touch switch" (hereinafter referred to as the "switch") which had been filed by the present applicant and was then published, and the contents thereof are as follows.

Referring to the drawings illustrated, a conventional switch 10 includes an upper substrate 11, a lower substrate 12, a sensor electrode 13, an electrode pad 14, a current-carrying member 15, and a capacitance sensing circuit 16.

The upper substrate 11 is made of a non-conductive material, a surface thereof which comes into direct and indirect contact with the human body is formed in a curved surface, and the conductive sensor electrode 13 is provided in an inner side thereof.

The lower substrate 12 is a printed circuit board (PCB) and is provided to face the upper substrate 11, and the electrode pad 14 is provided at a portion which is opposite to the sensor electrode 13.

The current-carrying member 15 is provided between the sensor electrode 13 and the electrode pad 14, and as a compressive coil spring, the current-carrying member 15 becomes elastic to the sensor electrode 13 and the electrode pad 14, and is electrically connected to the sensor electrode 13 and the electrode pad 14, respectively.

As such, the touch switch 10 is configured such that when the upper substrate 11 comes into contact with a user's finger, a variation in capacitance is transmitted to the capacitance sensing circuit 16 through the sensor electrode 13, the current-carrying member 15 and the electrode pad 14 according to the variation in composite capacitance of the upper substrate 11 made of non-conductive materials and capacitance of the human body, thereby enabling the human body's touch to be sensitively sensed.

However, as described above, the conventional switch 10 is problematic in that a variation in capacitance between the sensor electrode 13 and the electrode pad 14 is not sensed when the current-carrying member 15 composed of the compressive coil spring loses buffer power.

Also, it is problematic in that the current-carrying member 15 provided at both ends based on an illustrated direction is a shorter life span because a difference in buffer power between the current-carrying member 15 provided at both ends and another current-carrying member 15 provided in a center portion based on the illustrated direction occurs.

Also, as described above, it is problematic in that a variation in capacitance is not accurately transmitted to the capacitance sensing circuit 16 due to the difference in buffer power.

DISCLOSURE OF INVENTION

Technical Problem

The present invention has been made keeping in mind the above problems occurring in the prior art, and an object of the present invention is to provide a touch switch of an electronic device, which is capable of accurately sensing a variation in capacitance even when the electronic device is used over a long time.

Also, another object of the present invention is to provide the structure of a touch switch which is capable of sensing a constant variation in capacitance regardless of whether a cover panel of an entire surface being in contact with a human body is curved or flat.

Solution to Problem

In order to accomplish the above objects, the present invention provides a capacitance-sensitive touch switch, the touch switch including: a cover panel having a plurality of touch buttons arranged at a front surface thereof, and having at least one first coupling member arranged at each side of an edge thereof; an electrostatic panel provided on a rear surface of the cover panel, having lighting holes formed at a position being opposite to the touch buttons, and having electrostatic conductors formed integrally with the electrostatic panel in a direction perpendicular to the electrostatic panel at one side of the electrostatic panel adjacent to the lighting holes; a support panel having a second coupling member arranged at an edge corresponding to a position being opposite to the first coupling member arranged at the edge of the cover panel, having lighting holes formed at a position being opposite to the lighting holes of the electrostatic panel, and having through-holes formed adjacent to the lighting holes such that the electrostatic conductors pass through the through-holes; and a control board arranged at one side of the support panel, having a plurality of light emitting elements provided at a position being opposite to the lighting holes formed in the support panel, having at one side thereof adjacent to the light emitting elements through-holes for passage of the electrostatic conductors, and having at a rear surface of the light emitting elements one or more sensing means connected to respective ends of the electrostatic conductors passing through the through-holes.

Also, the front surface of the cover panel may be formed in any one of a curved surface and a flat surface.

Also, the first coupling member may have a quadrangular coupling hole formed in the center thereof, and the second coupling member may be composed a protrusion inserted into and connected to the coupling hole of the first coupling member.

Also, the protrusion may have a right-angled triangular shape such that a slope is gradually increased from one side of a cross section to another side so as to be easily inserted to the coupling hole.

Also, the first coupling member may further have a cut portion formed at both sides thereof so as to be easily separated from the second coupling member.

Also, the cover panel may be configured such that an entire surface thereof made of a transparent material is printed, and thereafter, a region of the touch buttons is cut by a laser beam so that light can be transmitted, thereby allowing easy recognition of the touch buttons even in a dark environment.

Also, the touch buttons of the cover panel may be configured such that an upper portion thereof made of a soft transparent synthetic resin is printed with a pattern.

Also, the electrostatic panel may be made of polycarbonate (PC) resin, and the plurality of electrostatic conductors provided in the direction perpendicular to the electrostatic panel may be formed by plating an acrylonitrile butadiene styrene (ABS) resin surface with a conductive material.

Also, the electrostatic conductors 230 may be a conductive metal composed of any one of silver (Ag), iron (Fe), aluminum (Al), stainless (STS), copper (Cu), lead (Pb), and gold (Au).

Also, regardless of whether an entire surface of the electrostatic panel is curved or flat, respective ends of the electrostatic conductors are collinearly provided so that capacitance can be uniformly transmitted to the sensing means provided at the control board.

Advantageous Effects of Invention

Accordingly, it is advantageous in that a touch switch of an electronic device can accurately sense a variation in capacitance even when the electronic device is used over a long time.

Also, it is advantageous in that the structure of a touch switch can sense a constant variation in capacitance regardless of whether a cover panel of an entire surface being in contact with a human body is curved or flat.

MODE FOR THE INVENTION

Figure 1:
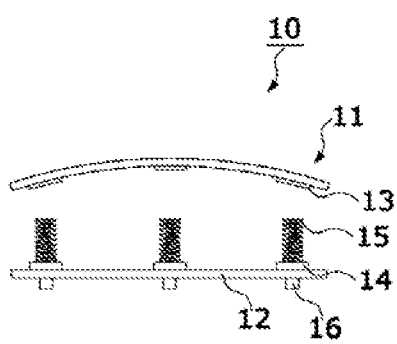
FIG. 1 is a view showing a conventional touch switch.
Figure 1:
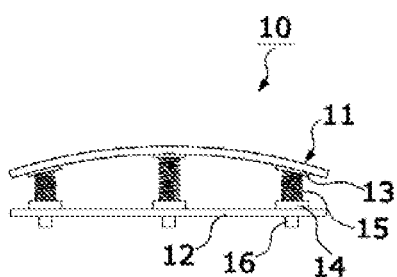
Figure 2:
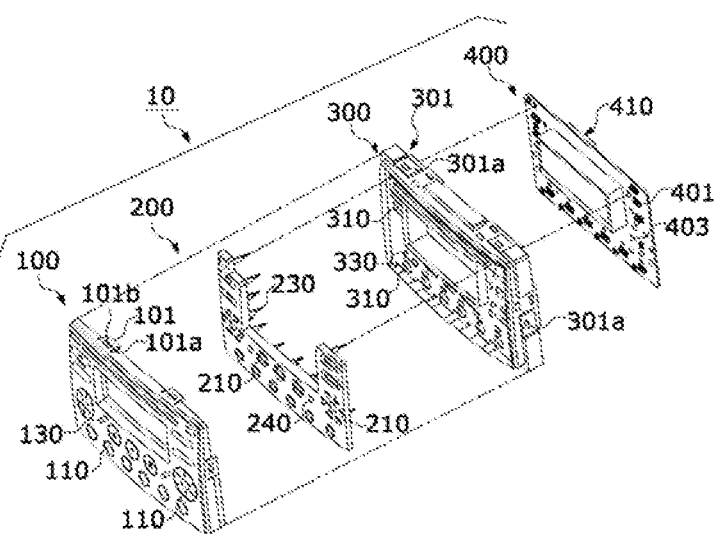
FIG. 2 is an exploded perspective view showing the configuration of a capacitance-sensitive touch switch according to the present invention.
Figure 3:
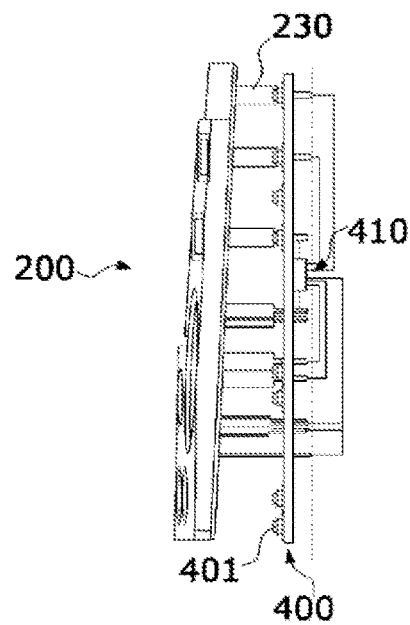
FIG. 3 is one side view showing an electrostatic conductor of the capacitance-sensitive touch switch according to the present invention.

Referring to FIGS. 2 to 5, a capacitance-sensitive touch switch 10 (hereinafter referred to as "the touch switch") according to the present invention is classified roughly into a cover panel 100, an electrostatic panel 200, a support panel 300, and a control board 400.

The cover panel 100 is made of a non-conductive material, namely, a plastic (PC: poly carbonate) material representatively among plastic, glass, ceramic, and wood, and a plurality of touch buttons 110 is provided on a surface of the cover panel so as to come into contact with the human body, and a plurality of first coupling member 101 is provided at an edge portion of the cover panel 100 so as to be connected to a second coupling member 301 of the support panel 300 which will be described later.

Figure 5:
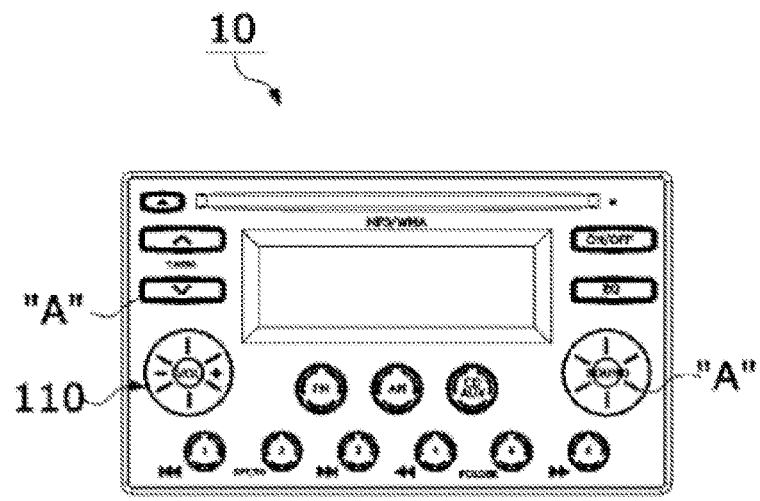
FIG. 5 is a view of a capacitance-sensitive touch switch according to the present invention as viewed from the front.

The cover panel 100 is configured such that an entire surface of a transparent synthetic resin is entirely printed in a predetermined color, and thereafter, only a region of the touch buttons 110 is cut in a shape (a region denoted by "A") as shown in FIG. 5, thereby allowing easy light transmission of a light emitting element 401 provided at the control board 400.

In addition, the touch buttons 110 of a soft transparent synthetic resin, namely, any one of soft synthetic resins such as poly urethane, rubber, and the like are integrally formed with the cover panel 100, and an upper portion thereof is printed with a pattern, and thus when a user touches the touch buttons, the user can feel that the touch buttons are pressed, and the transmission of light can be also easily performed, thereby enabling the desired objects of the present invention to be accomplished.

As such, a method of integrally forming the cover panel 100 made of the PC material and the touch buttons 110 made of the soft synthetic resin may be realized by double injection.

Hereinafter, the double injection will be briefly described.

Double injection is an injection method in which one component may be formed by combining two kinds of resin, and also is a method of performing molding by installing two sets of molds in an injection molding machine, molding a first molded product (for example, a cover panel) in a first mold, and thereafter, injecting a secondary resin into a cavity of a second mold and a space of the first molded product so that the first molded product can be secondarily molded.

Accordingly, the cover panel 100 according to the present invention is primarily molded, and the touch buttons 110 made of the soft synthetic resin are secondarily molded so that an integrated configuration can be formed.

Meanwhile, at least one first coupling member 101 is provided at an edge portion of the cover panel 100 and is formed in roughly a rectangular shape, and a cut portion 101a is formed at both sides thereof.

The formation of the cut portion 101a is intended to lift up an end portion of the first coupling member 101 easily and to easily separate the first coupling member 101 from the second coupling member 301 in an operation which will be described later. A quadrangular coupling hole 101b is formed in the center of the first coupling member 101.

The cover panel 100 described above may be formed in a flat surface or non-flat surface according to an installation situation of an electronic device, and in the present embodiment, an embodiment in which the cover panel 100 is formed in a curved surface having a predetermined curvature is based on for its explanation.

Also, a knob 130 is provided at an inner side of the cover panel 100 so as to be easily connected to the electrostatic panel 200 which will be described later.

As such, the electrostatic panel 200 is provided to a rear surface of the cover panel 100.

The electrostatic panel 200 made of a PC material as the cover panel 100 has lighting holes 210 formed at a position being opposite to the touch buttons 110.

The lighting holes 210 are formed to ensure easily transmission of light emitted from the light emitting element 401 of the control board 400 which will be described later.

The electrostatic conductors 230 in a bar-like shape are integrally provided with the electrostatic panel in a direction perpendicular to one side adjacent to the lighting holes 210, namely, a horizontal direction based on an illustrated direction.

The electrostatic conductors 230 are integrally formed with the aforesaid electrostatic panel, and unlike the electrostatic panel 200 made of a poly carbonate (PC) material, the electrostatic conductors are made of an acrylonitrile butadiene styrene (ABC) resin so that plating of the conductors can be easily performed.

The ABS resin is a generic term for an impact resistant thermoplastic resin composed of three ingredients such as acrylonitrile, butadiene, and styrene, and based on their initials, it is called the ABS resin.

As such, the ABS resin has improved mechanical strength, thermal resistance, oil resistance, weather resistance and the like while maintaining excellent permeability and processability, and an excellent electrical property. The ABS resin is a material which is optimized in terms of a transfer characteristic of capacitance in an operation which will be described later.

As such, that the electrostatic conductors 230 made of the ABS resin may be integrally formed with the electrostatic panel 200 made of the PC resin can be also realized by the aforesaid double injection. (Since the double injection has been explained in the aforesaid contents, a separate explanation thereon will be omitted.)

As such, the electrostatic conductors 230 integrally formed with the electrostatic panel is coated with a plating material composed of any one of nickel (Ni), chrome (Cr), and gold (Au) so that the transfer of capacitance can be maximized.

The electrostatic conductors 230 may be formed by integrating a metal having excellent electrical conductivity, namely, any one conductive metal of silver (Ag), iron (Fe), aluminum (Al), stainless (STS), copper (Cu), lead (Pb), and gold (Au) as well as the ABS resin with the electrostatic panel 200.

As such, a method of integrally forming the electrostatic panel 200 made of the PC resin and the electrostatic conductors 230 made of the conductive metal may be realized by an insert injection method.

Insert injection is a molding method of integrating different kinds or different colors of synthetic resins in a mold, or parts (metal, tree, paper, fabric and the like) except for the synthetic resins. In particular, in the case of a product integrated with a metal, a high value product can be produced by combining stiffness, conductivity and surface treatability possessed by the metal with an electric insulating property, a coloring property, flexibility, processability possessed by the synthetic resin.

As such, the electrostatic conductors 230 according to the present invention may be integrally formed with the electrostatic panel by doubly injecting the ABS resin with the electrostatic panel 200 or by integrally forming a metal having excellent conductivity with the electrostatic panel 200 using the insert injection method, end portions of the electrostatic conductors 230 are collinearly formed to be coincident with each other in a vertical direction regardless of whether the electrostatic panel is flat or curved, so capacitance operates uniformly in an operation which will be described later.

Meanwhile, a knob insertion hole 240 is formed in the electrostatic panel 200 so as to be connected to the knob 130 provided at the aforesaid cover panel 100.

The support panel 300 is provided to a rear surface of the electrostatic panel 200 composed of such a configuration, and the support panel 300 is provided with the second coupling member 301, the lighting holes 310 and the through holes 330. [80] The second coupling member 301 is a protrusion 301a formed in a right-angled triangular shape in which a slope is gradually increased from one side of a cross section to another and is configured to be easily inserted into a coupling hole 101b of the first coupling member 101 of the aforesaid cover panel 100 and to be prevented from being separated arbitrarily after completion of the insertion released.

Meanwhile, the support panel 300 has lighting holes 310 formed at a position being opposite to the lighting holes 210 of the aforesaid electrostatic panel 200, and through-holes 330 are formed at one side adjacent to the lighting holes 310 so that the electrostatic conductors 230 pass therethrough.

The control board 400 is provided to the rear of the support panel 300, and the control board 400 is composed of a light emitting element 401 and a sensing means 410.

The light emitting element 401 is a light emitting diode (LED), and is provided so as to irradiate light to the touch buttons provided on the cover panel 100 through the lighting holes 210 310 formed in each of the electrostatic panel 200 and the support panel 300.

Through-holes 403 are formed at one side adjacent to the light emitting element 401 so that the electrostatic conductors go therethrough.

At least one sensing means 410 connected to each end portion of the electrostatic conductors 230 passing through the through-holes 403 is provided on a rear surface of the light emitting element 401.

The sensing means 410 is a capacitance touch sensor and detects that a conductor such as the user's finger is close to the touch buttons 110 or is in contact with the touch buttons 110 depending a variation in capacitance resulting from a variation in dielectric constant when the dielectric constant of the electrostatic conductors 230 is changed as the conductor such as the user's finger is close to the touch buttons 110 or is in contact with the touch buttons, thereby generating a switching signal depending on the detection result.

A method of assembling the touch switch 10 according to the present invention composed of such a configuration will be hereinafter described.

First, at least one knob 130 formed at the inner side of the cover panel 100 is inserted into the knob insertion hole 240 formed in the electrostatic panel 200, so a primary combination is completed.

Next, the protrusion 301a of the second coupling member 301 formed at the edge of the support panel 300 is inserted into the coupling hole 101b of the first coupling member 101 formed at the edge of the cover panel 100, so a combination of the cover panel 100 and the support panel 300 is completed.

Figure 4:
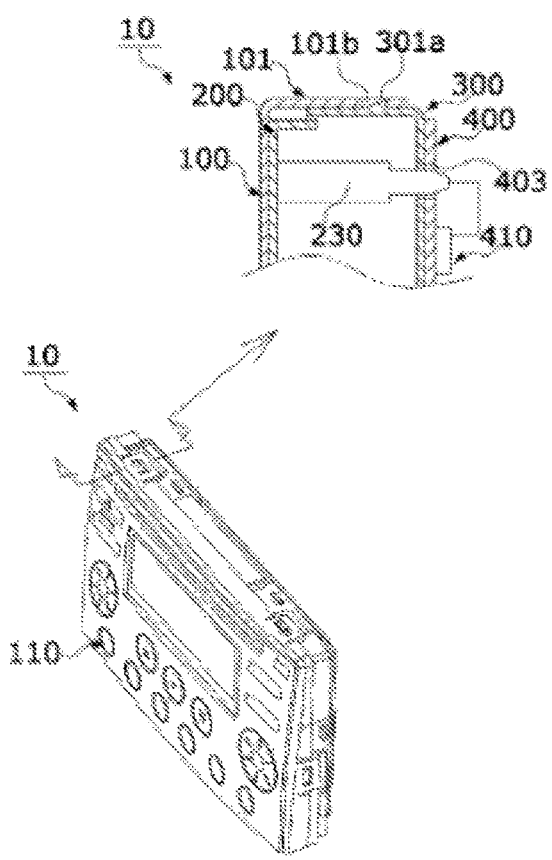
FIG. 4 is a perspective view showing an outward form of the capacitance-sensitive touch switch according to the present invention, in which a combination is completed.

The control board 400 is mounted on the rear surface of the support panel in which such a combination is completed, and at least one sensing means 410 is connected to the respective end portion of the electrostatic conductors 230 protruding by passing through the through-holes 403 of the control board 400, so as illustrated in FIG. 4, assembly is completed.

Continuously, an operations and effect of the touch switch 10 according to the present invention will be described with reference to FIGS. 4 and 5.

First, when the user's finger touches any one of the plurality of touch buttons 110 provided on the aforesaid cover panel, static electricity generated from the human body causes a variation in dielectric constant of the electrostatic conductors 230 integrally provided with the electrostatic panel 200.

Accordingly, the sensing means 410, which is a capacitance sensing sensor connected to the electrostatic conductors 230, detects that the user's finger, which is a conductor, touches the touch switches 110 by changing the capacitance depending on the variation in the dielectric constant as described above, and then generates a switching signal according to the detection signal.

Thus, the sensing means 410 senses the variation in the capacitance, outputs a relevant signal, and controls the operation of an electronic device which is not illustrated.

Figure 6:
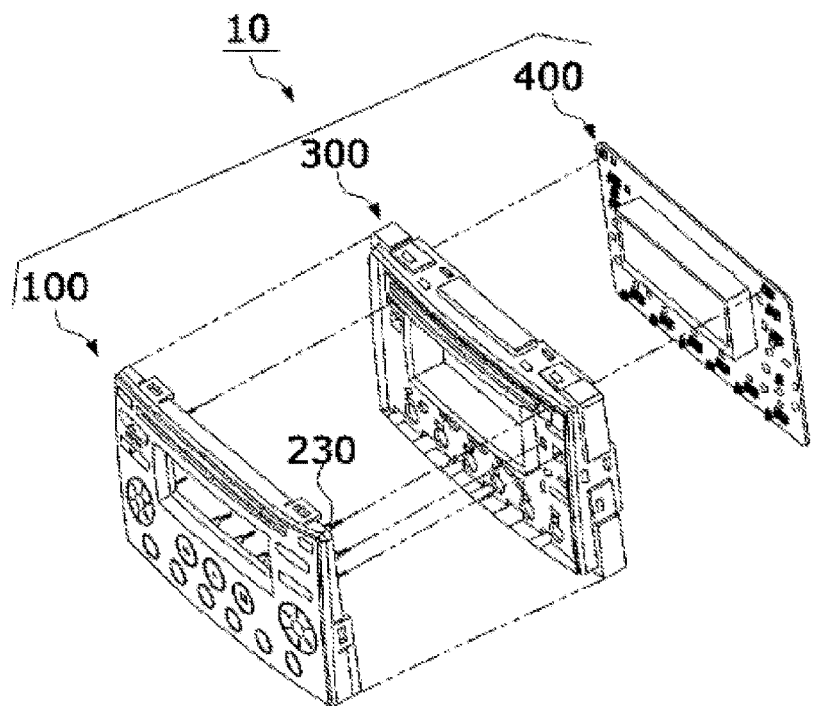
FIG. 6 is an exploded perspective view showing another embodiment of a capacitance-sensitive touch switch according to the present invention.

FIG. 6 illustrates another embodiment of a capacitance-sensitive touch switch according to the present invention and shows that, in the present embodiment, the electrostatic conductors 230 may be integrally formed with the touch buttons 110 of the cover panel 100, and the touch switch may be composed of the cover panel 100, the support panel 300, and the control board 400. The desired objects of the present invention may be also accomplished by the touch switch 10 composed of such a configuration may also accomplish.

As described above, according to the capacitance-sensitive touch switch 10 according to the embodiments of the present invention, there may be provided a touch switch of an electronic device, which is capable of accurately sensing a variation in capacitance even when the electronic device is used over a long time, and the structure of a touch switch which is capable of sensing a constant variation in capacitance regardless of whether a cover panel of an entire surface being in contact with a human body is curved or flat.

The foregoing is illustrative of embodiments and is not to be construed as limiting thereof. Although a few embodiments have been described, those skilled in the art will readily appreciate that many modifications are possible in embodiments without materially departing from the novel teachings and advantages. Accordingly, all such modifications are intended to be included within the scope of this inventive concept as defined in the claims. In the claims, means-plus-function clauses are intended to cover the structures described herein as performing the recited function, and not only structural equivalents but also equivalent structures.

What is claimed is:

1. A capacitance-sensitive touch switch (10), which is provided in an electronic device, the touch switch (10) comprising:
    a cover panel (100) having a plurality of touch buttons (110) arranged at a front surface thereof, and having at least one first coupling member (101) arranged at each side of an edge thereof;
    an electrostatic panel (200) provided on a rear surface of the cover panel (100), having lighting holes (210) formed at a position being opposite to the touch buttons, and having electrostatic conductors (230) formed integrally with the electrostatic panel in a direction perpendicular to the electrostatic panel at one side of the electrostatic panel adjacent to the lighting hole (210);
    a support panel (310) having a second coupling member (301) arranged at an edge corresponding to a position being opposite to the first coupling member (101) arranged at an edge of the cover panel (100), having lighting holes (310) formed at a position being opposite to the lighting holes (210) of the electrostatic panel (200), and having through-holes (330) formed adjacent to the lighting holes (310) such that the electrostatic conductors (230) pass through the through-holes; and
    a control board (400) arranged at one side of the support panel (300), having a plurality of light emitting elements (401) provided at a position being opposite to the lighting holes (310) formed in the support panel (300), having at one side thereof adjacent to the light emitting elements (401) through-holes (403) for passage of the electrostatic conductors (230), and having at a rear surfaces of the light emitting elements (401) one or more sensing means (410) connected to respective ends of the electrostatic conductors (230) passing through the through-holes (403).

2. The touch switch of claim 1, wherein an entire surface of the cover panel (100) is formed in any one of a curved surface and a flat surface.

3. The touch switch of claim 1, wherein the first coupling member (101) has a quadrangular coupling hole (101*b*) formed in the center thereof, and the second coupling member is composed of a protrusion (301*a*) inserted into and connected to the coupling hole (101*b*) of the first coupling member.

4. The touch switch of claim 3, wherein the protrusion (301*a*) has a right-angled triangular shape such that a slope is gradually increased from one side of a cross section to another side so as to be easily inserted to the coupling hole (101*b*).

5. The touch switch of claim 1, wherein the first coupling member (101) further has a cut portion (101*a*) formed at both sides thereof so as to be easily separated from the second coupling member (301).

6. The touch switch of claim 1, wherein the cover panel (100) is configured such that the entire surface thereof made of a transparent material is printed, and thereafter, a region of the touch buttons (110) is cut by a laser beam so that light can be transmitted, thereby allowing easy recognition of the touch buttons even in a dark environment.

7. The touch switch of claim 1, wherein the touch buttons (110) of the cover panel (100) are configured such that an upper portion thereof made of a soft transparent synthetic resin is printed with a pattern.

8. The touch switch of claim 1, wherein the electrostatic panel (200) is made of polycarbonate (PC) resin, and the plurality of electrostatic conductors provided in the direction perpendicular to the electrostatic panel (200) are formed by plating an acrylonitrile butadiene styrene (ABS) resin surface with a conductive material.

9. The touch switch of claim 1, wherein the electrostatic conductors (230) are a conductive metal composed of any one of silver (Ag), iron (Fe), aluminum (Al), stainless (STS), copper (Cu), lead (Pb), and gold (Au).

10. The touch switch of claim 1, wherein regardless of whether an entire surface of the electrostatic panel (200) is curved or flat, respective ends of the electrostatic conductors (230) are collinearly provided so that capacitance can be uniformly transmitted to the sensing means (410) provided at the control board (400).

* * * * *